(12) United States Patent
Yang

(10) Patent No.: US 7,697,352 B2
(45) Date of Patent: Apr. 13, 2010

(54) READ-AND-WRITE ASSEMBLY FOR FIXED-ADDRESS DIGITAL DATA ACCESS SYSTEM

(76) Inventor: Ching-Hsi Yang, 3F, No. 42, Lane 61, Her Jiang St., Taipei (TW)

(*) Notice: Subject to any disclaimer, the term of this patent is extended or adjusted under 35 U.S.C. 154(b) by 823 days.

(21) Appl. No.: 11/558,862

(22) Filed: Nov. 10, 2006

(65) Prior Publication Data

US 2008/0112305 A1    May 15, 2008

(51) Int. Cl.
*G11C 7/00* (2006.01)
(52) U.S. Cl. .......... 365/189.14; 365/171; 365/189.011; 360/110
(58) Field of Classification Search ........... 360/110, 360/123.01; 365/171, 189.011, 189.14, 225.5
See application file for complete search history.

(56) References Cited

U.S. PATENT DOCUMENTS

| | | | | |
|---|---|---|---|---|
| 4,972,287 A * | 11/1990 | Das | .................. | 360/123.05 |
| 6,275,354 B1 * | 8/2001 | Huai et al. | ............. | 360/123.61 |
| 6,600,697 B2 * | 7/2003 | Tahira et al. | ............. | 369/13.17 |
| 6,650,496 B2 * | 11/2003 | Nozieres et al. | ............... | 360/63 |
| 7,016,253 B2 * | 3/2006 | Yang | ..................... | 365/230.01 |
| 7,130,152 B1 * | 10/2006 | Raymond et al. | ........... | 360/121 |
| 2008/0186625 A1 * | 8/2008 | Yang | ......................... | 360/110 |
| 2009/0198941 A1 * | 8/2009 | Yang | ......................... | 711/167 |

* cited by examiner

*Primary Examiner*—Dang T Nguyen
*Assistant Examiner*—Alexander Sofocleous
(74) *Attorney, Agent, or Firm*—WPAT, PC; Justin King

(57) ABSTRACT

A read-and-write assembly is described. The read-and-write assembly includes one or more coils and magnetizable pillars. The magnetizable pillar has a flask shape and a neck wrapped in the coil.

8 Claims, 4 Drawing Sheets

READ-AND-WRITE ASSEMBLY FOR FIXED-ADDRESS DIGITAL DATA ACCESS SYSTEM

CROSS-REFERENCE TO RELATED APPLICATIONS

The present application is related to U.S. patent application Ser. No. 7,016,253, filed on Nov. 5, 2003, entitled "Fixed-address digital data access system", which has common inventors.

FIELD OF THE INVENTION

This invention relates generally to a read-and-write assembly and more particular, to a fixed-address digital data access system.

BACKGROUND

As electronic technologies are fast developed, hardware and software are both quickly and continuously improved. Nowadays, digital data access devices fall into three main categories: the magnetic disk, the compact disk (CD) and the flash memory. The magnetic disk utilizes magnetic properties of magnetic media for data storage. The magnetic disk further falls into two categories: the fixed hard disk drive (HD) and the portable floppy disk drive. Common magnetic media includes magnetic disks, magnetic tapes . . . etc. They are most commonly used in modern computer systems for data storage.

The compact disk, usually referred to as a small disk, utilizes optical burning for digital data storage. The compact disk has a data storage structure separated into two levels: the session level and the track level. The compact disk is advantageous with its large data capacity and portability today. However, compared to data capacity, reading speed and reusability of the hard disk drive, the compact disk cannot replace the hard disk drive.

The hard disk drive is also not replaced by the floppy disk drive. The floppy disk drive, used for common personal computers, is advantageous with its portability. However, as the demand amount for data exchange grows larger and larger, the small-data-capacity and slow-reading-speed floppy disk drives are gradually eliminated through competition.

With large data capacity and fast reading speed, the hard disk drive is the most popular data access apparatus in current computer systems. The hard disk drive comprises a plurality of magnetic disks on which data are stored magnetically. Each magnetic disk has two surfaces for data storage; each surface of the magnetic disk has a plurality of concentric circular areas called tracks. Each track is separated into a plurality of sectors. A sector is the smallest unit for data access in a disk drive.

The cylinder, head and sector are the three major parts of a hard disk drive. The cylinder is formed by a plurality of tracks at corresponding positions on different disks. The head is corresponded to the number of disk surfaces. The sector is a common unit used for both the hard and floppy disk drives, and is the smallest unit for data access in a disk drive. A sector has a size of 512 bytes.

The above cylinder and head, where the target sector locates, determine the addressing or mapping work for a hard disk drive. This addressing or mapping method is called the CHS (Cylinder Head Sector) mapping or CHS addressing method. However, during the method was developed, the IDE interface, which is used for integrating the hard disk into the personal computer system, could support a single hard disk drive only 512 MB as the maximum capacity.

Later, Large mode, a new working mode for the addressing method, came out and solved the problem. The Large mode enables the hard disk to have a capacity up to 2 GB. Another more popular addressing method for the hard disk drive is the Logical Block Addressing(LBA). LBA is able to support hard disks with capacity more than 8.4 GB.

The logical block addressing method utilizes logical reflection for addressing specific sectors and is broadly used in some of the common interfaces devices in current personal computer systems like enhanced IDE interface devices and small computer system interface(SCSI) devices. Conventional addressing/mapping works for the hard disk drive are physical addressing/mapping. For example, we can track a sector to a detail of on which disk and track the sector is. This kind of description for the sector location also represents the physical location of the sector in a hard disk drive in reality.

Accordingly, the compact disk is easy to carry but it still is not a choice for replacing the conventional hard disk drive for the unsolved limitations such as the data capacity and reading speed. The conventional hard disk drive though has its own disadvantages, especially that the conventional hard disk drive must be driven by an electrically-powered motor, which sets great limitations in sizing-down design work. Furthermore, the electrically-powered motor is even more disadvantageous for devices with power efficiency needs such as notebooks. Another example of size and power consumption related limitations on the application of the conventional hard disk drive set by the electrically-powered motor is the personal digital assistant (PDA).

On the other hand, the speed of the conventional hard disk drive is mostly determined by the running speed of the electrically-powered motor, thus to increase the speed of the hard disk drive, the running speed of the powered motor must be increased, too. However, the motor generates heat while running, thus the faster the motor runs, the more difficult the overall design for the whole system is, considering heat ventilation; which is unfavorable for developing high-speed hard disk drives. In addition, as the electrically-powered motor comprises several components, different modules are needed for manufacturing a single motor, which increases the manufacturing cost and makes the hard disk drive easily broken through shocks or collisions. There is still another disadvantage of the implement of the electrically-powered motor in a hard disk drive, which is the noise coming out when the motor is in action. Moreover, the faster the motor runs, the louder the noise is; which is again unfavorable for developing high speed hard drives. Accordingly, there are still lots of limitations on the conventional hard disk drive techniques that need to be overcome.

SUMMARY

In one aspect of the present invention, a read-and-write assembly is provided. The read-and-write assembly may comprise a first coil and a first magnetizable pillar. The first magnetizable pillar has a first flask shape and a first neck wrapped in the first coil.

The read-and-write assembly may further comprise a second coil and a second magnetizable pillar. The second magnetizable pillar has a second flask shape and having a second neck wrapped in the second coil.

The read-and-write assembly may further comprise a magnetic film. The magnetic film has a first and a second sub-micrometer-sized regions respectively adjacent to the first and the second magnetizable pillars.

In another aspect of the present invention, a writing and reading method is provided. In the method, two flask-shaped pillars are provided. Each of the flask-shaped pillars has a neck and a body. The necks of the flask-shaped pillars are wrapped in two coils respectively. The method comprises a writing process and a reading process. In the writing process, the coils are energized to form two magnetic fields through the flask-shaped pillars, thereby magnetizing two sub-micrometer-sized regions adjacent to the bodies of the flask-shaped pillars. In the reading process, the flask-shaped pillars are magnetized by the magnetized sub-micrometer-sized regions, whereby two currents are generated through the coils.

In yet another aspect of the present invention, a fixed-address digital data access system is provided. The system comprises a control module and an access module. The control module has a control sub-circuitry. The control sub-circuitry has at least one data access address table for storing information about a plurality of data access addresses. The access module has an electromagnetic-inductive sub-circuitry on a magnetic film. The access module is electrically coupled with the control module for the control module to control the access module. The electromagnetic-inductive sub-circuitry has a plurality of coils and a plurality of magnetizable and flask-shaped pillars each partially wrapped in the coils respectively.

DETAILED DESCRIPTION OF THE INVENTION

Figure 1:
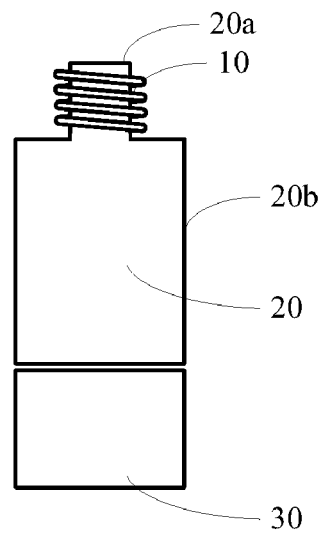
FIG. 1 schematically illustrates a first read-and-write head is provided in accordance with a first embodiment in the present invention.

The present invention is related to a read-and-write assembly. The structure and working mechanism will now be described in greater detail to make the present invention more readily appreciated. Obviously, the present invention should not be limited in the details known to those skilled in the art, and well known devices will not be described herein to avoid unnecessary limitations. Preferred embodiments will now be described in greater detail. Nevertheless, it should be recognized that the present invention can be practiced in a wide range of other embodiments besides those explicitly described, and the scope of the present invention is expressly not limited except as specified in the accompany claims Reference is now made to FIG. 1, in a first embodiment of the present invention, a first read-and-write head is provided. The first read-and-write head may comprise a first coil 10 and a first pillar 20. The first pillar 20 may be magnetizable, and may have a flask shape. The first flask-shaped pillar 20 has a first neck 20a and a first body 20b. The first neck 20a of the first flask-shaped pillar 20 is wrapped in the first coil 10.

In a writing process, the first coil 10 may be energized by, for example, applying an electrical current through the first coil 10, to form a first magnetic field through the first flask-shaped pillar 20. The first magnetic field magnetizes a first sub-micrometer-sized region 30 adjacent to the first body 20b of the first flask-shaped pillar 20.

In a reading process, the first flask-shaped pillar 20 may be magnetized by the magnetized first sub-micrometer-sized region 30. As a result, a first current is generated through the first coil 10.

Figure 2:
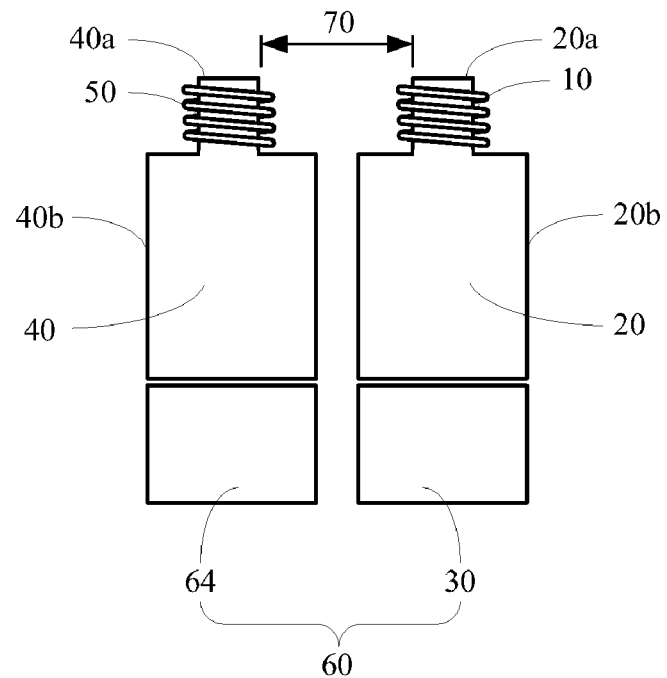
FIG. 2 schematically illustrates apparatus for writing and reading digital data in accordance with a second embodiment in the present invention.

Referring to FIG. 2, in a second embodiment of the present invention, apparatus for writing and reading digital data is provided. The apparatus may comprise a magnetic film 60, a first magnetizable pillar 20 and a second magnetizable pillar 40. The first magnetizable pillar 20 may have a first flask shape and may have a first neck 20a wrapped in a first coil 10. The second magnetizable pillar 40 may have a second flask shape and may have a second neck 40a wrapped in a second coil 50.

The magnetic film 60 may have a first sub-micrometer-sized region 30 and a second sub-micrometer-sized region 64. The first sub-micrometer-sized region 30 is adjacent to the first magnetizable pillar 20. The second sub-micrometer-sized region 64 is adjacent to the second magnetizable pillar 40.

In a first writing process, the first coil 10 may be energized to form a first magnetic field through the first magnetizable pillar 20. The first magnetic field magnetizes the first sub-micrometer-sized region 30 adjacent to the first body 20b of the first flask-shaped pillar 20.

In a first reading process, the first flask-shaped pillar 20 may be magnetized by the magnetized first sub-micrometer-sized region 30. As a result, a first current is generated through the first coil 10.

In a second writing process, the second coil 50 may be energized to form a second magnetic field through the second magnetizable pillar 40. The second magnetic field magnetizes the second sub-micrometer-sized region 64 adjacent to the second body 40b of the second flask-shaped pillar 40.

In a second reading process, the second flask-shaped pillar 40 may be magnetized by the magnetized second sub-micrometer-sized region 64. As a result, a second current is generated through the second coil 40a.

Because the above-mentioned regions both have sub-micrometer sizes, the adjacent first and second magnetizable pillars 20 and 40 also preferably have sub-micrometer sizes. Moreover, the first neck 20a is thinner than the first body 20b of the first magnetizable pillar 20, and the second neck 40a is thinner than the second body 40b of the second magnetizable pillar 40. The first neck 20a and the second neck 40a are both thin for leaving a space 70 between the first neck 20a and the second neck 40a. The space 70 is left for respectively wrapping the first and the second necks 20a and 40a in the first and the second coils 10 and 50.

When the first coil 20a is energized in the first writing process, the first coil 20a may electrically interfere with the second coil 40a. To ensure that this interference does not happen, two methods may be simultaneously or selectively applied. First, the space 70 between the first and the second necks 20a and 40a is preferably sized enough to reduce or even eliminate the coupling effect between the coils 10 and 50. Second, the first coil 10 is preferably to be energized by applying an electrical current, which current is too weak to electrically interfere with the second coil 50 but is strong enough to perform the first writing process.

When the magnetized first sub-micrometer-sized region magnetizes the first flask-shaped pillar in the first reading process, the first flask-shaped pillar may magnetically interfere with the second flask-shaped pillar. To ensure that this interference does not happen, two methods may be simultaneously or selectively applied. The first method may be spacing the bodies of the flask-shaped pillars enough to reduce or even eliminate the interference. The second method may be finding out the smallest electrical current need to apply to the first coil in the first writing process. The smallest electrical current minimizes the magnetic interfere between the flask-shaped pillars in the first reading process.

Figure 3:
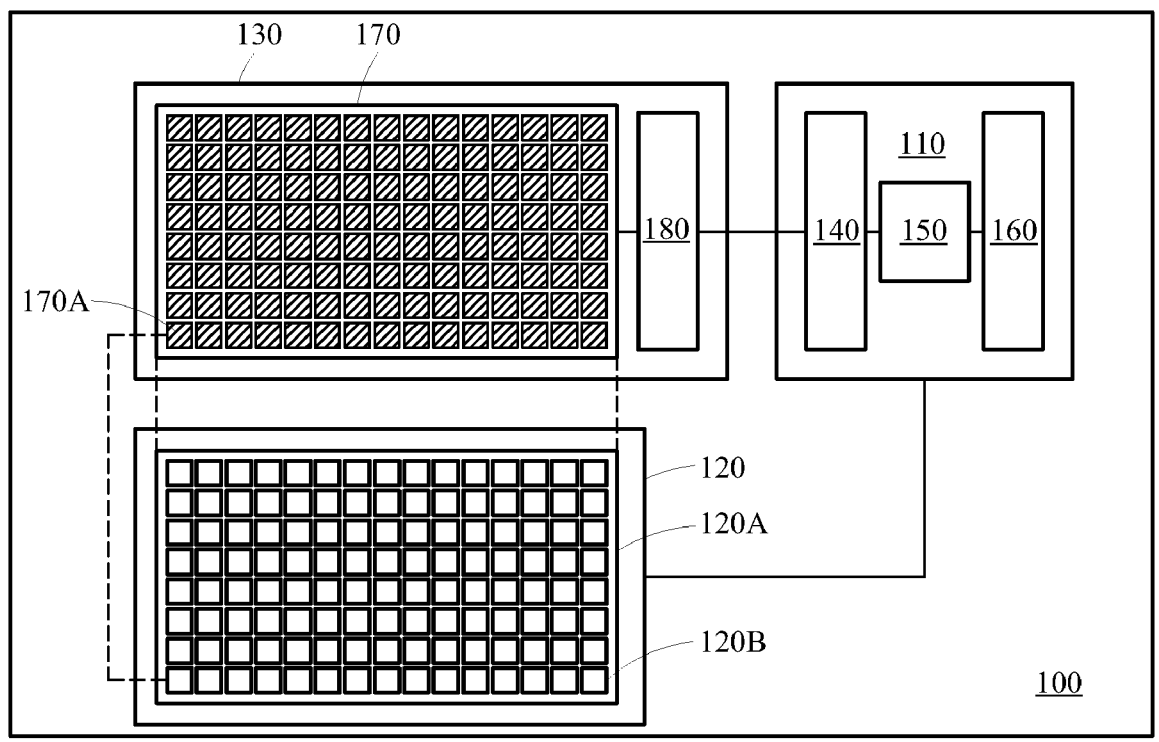
FIG. 3 is a block diagram illustrating the fixed-address digital data access system in accordance with a third embodiment in the present invention.

Reference is now made to FIG. 3, in a third embodiment of the present invention, a fixed-address digital data access system 100 is provided. The system 100 comprises a control module 110, a storage module 120 and an access module 130 wherein the control module 110 is electrically coupled with the access module 130 in order to control the access module 130; and the storage module 120 is removable. The control module 110 further comprises a connection interface 140, a control sub-circuitry 150 and at least one transmission interface 160, wherein the control sub-circuitry 150 is electrically coupled with the connection interface 140 and the at least one transmission interface 160, respectively; the system 100 communicates and exchange signals with external electronic devices via the transmission interface 160. The access module 130 further comprises an electromagnetic-inductive sub-circuitry 180 and an electromagnetic-inductive area 170 with a plurality of micro-data access devices 170A.

The micro-data access devices 170A are, for example, the first coil and magnetizable pillar and the second coil and magnetizable pillar in the second embodiment of the present invention The electromagnetic-inductive area 170 is electrically coupled with the electromagnetic-inductive sub-circuitry 180 and each of the micro-data access devices 170A is specifically located in the electromagnetic-inductive area 170.

Referring to FIG. 3, in this third embodiment, the storage module 120 further comprises at least one electromagnetic-inductive medium 120A wherein the at least one electromagnetic-inductive medium 120A of the storage module 120 is corresponding to the electromagnetic-inductive area 170 of the access module 130 with respect to the data access address. The at least one electromagnetic-inductive medium 120A has a plurality of digital data access areas 120B located therein according to a pre-determined order such that the plurality of digital data access areas 120B are corresponding to the plurality of micro-data access devices 170A with respect to the data access address, and that each of the micro-data access devices 170A is able to read and store digital data with corresponding digital data access area 120B thereof. The digital data access areas 120B are, for example, the first and the second sub-micrometer-sized regions in the first embodiment of the present invention.

When inserted in the fixed-address digital data access system 100, the storage module 120 receives power from the fixed-address digital data access system 100 such that the power needed by the access module 130 is reduced. Further, the storage module 120 is electrically coupled with the control module 110 whereby the control sub-circuitry 150 is able to control a specifically located micro-data access device 170A and the corresponding digital data access area 120B thereof at the same time. A conductive material is further used to make a part of the at least one electromagnetic-inductive medium 120A to strengthen the electromagnetic effect. The fixed-address digital data access system 100 works as follows: Initially, the storage module 120 is inserted into the fixed-address digital data access system 100. When digital data at a specific data access address are requested, an external electronic device transmits an access signal to the control module 110 via the at least one transmission interface 160 to read the data needed. Then, the control sub-circuitry 150 of the control module 110 transmits a control signal to the electromagnetic-inductive sub-circuitry 180 via the connection interface 140 to control the micro-data access device 170A and the corresponding electromagnetic medium 120A thereof for reading the requested digital data from the digital data access area 120B at the target data access address.

Figure 4:
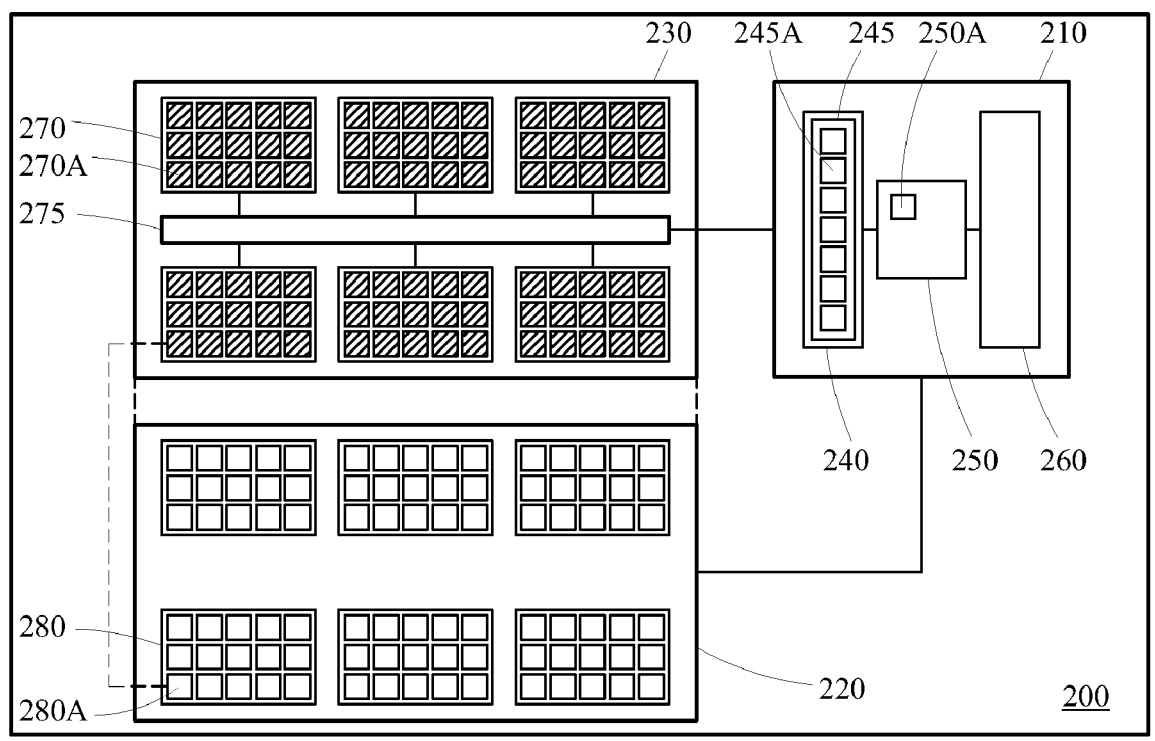
FIG. 4 is a block diagram illustrating the fixed-address digital data access system in accordance with a fourth preferred embodiment in the present invention.

Reference is now made to FIG. 4, in a fourth embodiment of the present invention, a fixed-address digital data access system 200 is provided. The system 200 comprises a control module 210, a storage module 220 and an access module 230 wherein the control module 210 is electrically coupled with the access module 230 in order to control the access module 230; and the storage module 220 is removable. The control module 210 further comprises a connection interface 240, a control sub-circuitry 250 and at least one transmission interface 260 wherein the control sub-circuitry 250 is electrically coupled with the connection interface 240 and the at least one transmission interface 260; the system 200 communicates and exchanges signals with external electronic devices via the transmission interface 260. The control sub-circuitry 250 further comprises at least one data access address table 250A for storing information about a plurality of data access addresses; the connection interface 240 comprises a switch sub-circuitry 245 for controlling a plurality of electromagnetic-inductive areas 270; the switch sub-circuitry 245 has a plurality of data access address switches 245A wherein each of the data access address switches 245A is corresponding to a single item in the data access address table 250A such that the control sub-circuitry 250 is able to control the plurality of data access address switches 245A of the switch sub-circuitry 245. The access module 230 further comprises an electromagnetic-inductive sub-circuitry 275 which has a plurality of electromagnetic-inductive areas 270; a plurality of micro-data access devices 270A are set in the electromagnetic-inductive area 270; and each micro-data access device 270A is set according to the data access address table 250A. The plurality of micro-data access devices 270A are electrically coupled with the plurality of data access address switches 245A in the switch sub-circuitry 245 via the electromagnetic-inductive sub-circuitry 275.

Referring to FIG. 4, in this fourth embodiment, the storage module 220 further comprises a plurality of electromagnetic-inductive media 280 wherein the plurality of electromagnetic-inductive media 280 are corresponding to the plurality of electromagnetic-inductive areas 270 of the access module 230 with respect to the data access address for electromagnetic data access. Each of the electromagnetic-inductive media 280 has a plurality of digital data access areas 280A located therein according to the data access address table 250A, in order to enable the plurality of digital data access areas 280A to correspond to the plurality of micro-data access devices 270A with respect to the data access address. The micro-data access devices 270A are, for example, the first coil and magnetizable pillar and the second coil and magnetizable pillar in the second embodiment of the present invention. The digital data access areas 280A are, for example, the first and the second sub-micrometer-sized regions in the second embodiment of the present invention.

When inserted in the fixed-address digital data access system 200, the storage module 220 receives power from the fixed-address digital data access system 200 such that the power needed by the access module 230 is reduced. Further, the storage module 220 is electrically coupled with the control module 210 whereby the control sub-circuitry 250 is able to control a specifically located micro-data access device 270A and the corresponding digital data access area 280A thereof at the same time. A conductive material is further used to make a part of each electromagnetic-inductive medium 280 to strengthen the electromagnetic effect. The fixed-address digital data access system 200 works as follows: Initially, the storage module 220 is inserted into the fixed-address digital data access system 200. When digital data at a specific data access address are requested, an external electronic device transmits an access signal to the control module 210 via the at least one transmission interface 260 to read the data needed. Then, the control sub-circuitry 250 of the control module 210 transmits a control signal to the switch sub-circuitry 245 of the connection interface 240 according to the data access address table 250A to turn on an data access address switch 245A specifically located. After that, the control signal is further transmitted to the electromagnetic-inductive sub-circuitry 275 of the access module 230 via the data access address switch 245A to control a specifically located micro-data access device 270A of the electromagnetic-inductive area 270 and the corresponding electromagnetic medium 280 thereof of the storage module 220 for reading the requested digital data from the digital data access area 280A at the target data access address.

Figure 5:
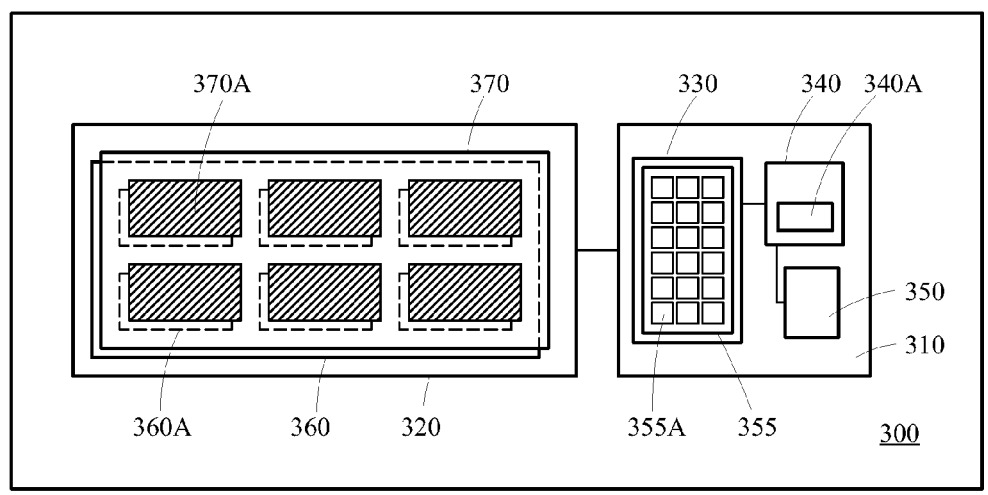
FIG. 5 is a block diagram illustrating the fixed-address digital data access system in accordance with a fifth preferred embodiment in the present invention.

Reference is now made to FIG. 5, in a fifth embodiment of the present invention, a fixed-address digital data access system 300 is provided. The system 300 comprises a control module 310 and an access module 320 wherein the control module 310 is electrically coupled with the access module 320 in order to control the access module 320; and the access module 320 is removable. The control module 310 further comprises a connection interface 330, a control sub-circuitry 340 and at least one transmission interface 350, wherein the control sub-circuitry 340 is electrically coupled with the connection interface 330 and the at least one transmission interface 350, respectively; the system 300 communicates and exchanges signals with external electronic devices via the at least one transmission interface 350; the access module 320 is electrically coupled with the control module 310 via the connection interface 330. The control sub-circuitry 340 further comprises at least one data access address table 340A for storing information about a plurality of data access addresses; the connection interface 330 comprises a switch sub-circuitry 355 for controlling a plurality of electromagnetic-inductive circuitries 370A.

Each of the electromagnetic-inductive circuitries 370A may be a read-and-write head in the first embodiment of the present invention. The switch sub-circuitry 355 has a plurality of data access address switches 355A wherein each of the data access address switches 355A is corresponding to a single item in the data access address table 340A such that the control sub-circuitry 340 is able to control the plurality of data access address switches 355A of the switch sub-circuitry 355. The access module 320 comprises at least one magnetic film 360 and an electromagnetic-inductive sub-circuitry 370 having a plurality of electromagnetic-inductive circuitries 370A, wherein the at least one magnetic film 360 is set in the plurality of electromagnetic-inductive circuitries 370A of the electromagnetic-inductive sub-circuitry 370 and the electromagnetic-inductive sub-circuitry 370 is electrically coupled with the switch sub-circuitry 355 such that each of the data access address switches 355A can also be electrically coupled with each of the electromagnetic-inductive circuitries 370A according the data access address table 340A.

Referring to FIG. 5, in this fifth embodiment, the at least one magnetic film 360 further comprises a plurality of data access areas 360A wherein the plurality of data access areas 360A are set in the plurality of electromagnetic-inductive circuitries 370A according to the data access address table 340A for electromagnetic digital data access.

Each of the plurality of electromagnetic-inductive circuitries 370A may be a read-and-write head in the first embodiment of the present invention. The control sub-circuitry 340 is able to control a specifically located electromagnetic-inductive circuitry 370A and the corresponding digital data access area 360A thereof at the same time via the connection interface 330. A conductive material is further used to make a part of the at least one magnetic film 360 to strengthen the electromagnetic effect. The fixed-address digital data access system 300 works as follows: Initially, the access module 320 is inserted into the fixed-address digital data access system 300. When digital data at a specific access address are requested, an external electronic device transmits an access signal to the control module 310 via the at least one transmission interface 350 to read the data needed. Then, the control sub-circuitry 340 of the control module 310 transmits a control signal to the switch sub-circuitry 355 of the connection interface 330 according to the data access address table 340A to turn on a specific data access address switch 355A. After that, the control signal is further transmitted to the electromagnetic-inductive sub-circuitry 370 of the access module 320 via the data access address switch 355A to control a specific micro-data access device 370A and the corresponding digital data access area 360A thereof of the at least one magnetic film 360 for reading the requested digital data from the digital data access area 360A at the target address.

Accordingly, in the preferred embodiments of the present invention, each of the plurality of the micro-data access devices or access circuitry is respectively set at specific addresses in the digital data access systems provided, which is totally different from the conventional hard disk drive data access mechanism. The present invention can be applied to any other digital data access system, and the mechanism for data access mentioned above has not been disclosed or developed in any digital data access system.

Obviously, many modifications and variations are possible in light of the above teachings. It is therefore to be understood that within the scope of the appended claims the present invention can be practiced otherwise than as specifically described herein. Although specific embodiments have been illustrated and described herein, it is obvious to those skilled in the art that many modifications of the present invention may be made without departing from what is intended to be limited solely by the appended claims.

What is claimed is:

1. A method of writing and reading, comprising:
providing at least one flask-shaped pillar having a neck and a body, the neck of the flask-shaped pillar being wrapped in a coil;
energizing the coil to form a magnetic field through the flask-shaped pillar, thereby magnetizing a sub-micrometer-sized region adjacent to the body of the flask-shaped pillar; and
magnetizing the flask-shaped pillar by the magnetized sub-micrometer-sized region, whereby a current is generated through the coil.

2. A fixed-address digital data access system, comprising:
a control module with a control sub-circuitry, wherein the control sub-circuitry has at least one data access address table for storing information about a plurality of data access addresses; and
an access module having an electromagnetic-inductive sub-circuitry on a magnetic film, wherein the access module is electrically coupled with the control module for the control module to control the access module, and wherein the electromagnetic-inductive sub-circuitry has a plurality of coils and a plurality of magnetizable and flask-shaped pillars partially wrapped in the coils respectively 3. The fixed-address digital data access system according to claim 2, wherein the control module further comprises a connection interface electrically coupled with the control sub-circuitry and the electromagnetic-inductive sub-circuitry respectively 4. The fixed-address digital data access system according to claim 3, wherein the connection interface has a switch sub-circuitry for controlling the magnetizable and flask-shaped pillars and coils.

5. The fixed-address digital data access system according to claim 4, wherein the switch sub-circuitry has a plurality of data access address switches.

6. The fixed-address digital data access system according to claim 5, wherein the electromagnetic-inductive sub-circuitry is electrically coupled with the switch sub-circuitry for each of the data access address switches to be electrically coupled with each of the coils and each of the magnetizable and flask-shaped pillars according to the data access address table.

7. The fixed-address digital data access system according to claim 6, wherein the magnetic film further comprises a plurality of digital data access areas.

8. The fixed-address digital data access system according to claim 7, wherein a conductive material is further used to make a part of the magnetic film to strengthen the electromagnetic effect.

* * * * *